US012644822B2

(12) United States Patent
Easterling

(10) Patent No.: US 12,644,822 B2
(45) Date of Patent: Jun. 2, 2026

(54) CONFIGURABLE TEST PLATFORM

(71) Applicant: PassiveLogic, Inc., Salt Lake City, UT (US)

(72) Inventor: John Easterling, Salt Lake City, UT (US)

(73) Assignee: PassiveLogic, Inc., Holladay, UT (US)

( * ) Notice: Subject to any disclaimer, the term of this patent is extended or adjusted under 35 U.S.C. 154(b) by 400 days.

(21) Appl. No.: 17/944,836

(22) Filed: Sep. 14, 2022

(65) Prior Publication Data

US 2024/0053254 A1     Feb. 15, 2024

Related U.S. Application Data

(60) Provisional application No. 63/397,129, filed on Aug. 11, 2022.

(51) Int. Cl.
*G01N 17/00*     (2006.01)
*G01R 21/02*     (2006.01)
*F24F 11/30*     (2018.01)

(52) U.S. Cl.
CPC ........... *G01N 17/002* (2013.01); *G01R 21/02* (2013.01); *F24F 11/30* (2018.01)

(58) Field of Classification Search
CPC .................................................. G01N 17/002
See application file for complete search history.

(56) References Cited

U.S. PATENT DOCUMENTS

2019/0309969 A1 * 10/2019 Park ........................ F24F 11/64

FOREIGN PATENT DOCUMENTS

DE     102020212574 A1 *  4/2022  ......... G06Q 10/0631

OTHER PUBLICATIONS

Machine translation of DE102020212574 (Year: 2020).*
"Weather Simulation Chamber", ESPEC Corp, last accessed Dec. 8, 2022, https://www.espec.co.jp/english/products/env-test/met/.
Mitsubishi, "Artificial Climatic Experiment Facilities", Mitsubishi Heavy Industries, Dec. 8, 2022. https://www.mhi.com/products/industry/weather_simulation_chamber.html.
Satoru Hosokawa, Installation Example: All-Weather Simulation Chamber, Last Accessed Dec. 8, 2022, https://www.test.navi.com/eng/report/pdf/InstallationExample_All-WeatherSimulationChamber-SaitamaIndustrialTechnologyCenter_SAITEC.pdf.

* cited by examiner

*Primary Examiner* — Walter L Lindsay, Jr.
*Assistant Examiner* — Andrew V Do

(57)     ABSTRACT
Various embodiments described herein relate to a test chamber device an associated methods and non-transitory machine-readable media including a test chamber, a system builder that is configured to build and apply an equipment load to the test chamber; a load maker that is configured to build and apply a predefined load to the test chamber; and a tester which measures action of the equipment load and the predefined load within the test chamber, producing a test state.

20 Claims, 13 Drawing Sheets

600b1
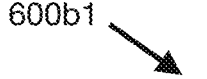
FIG. 6b1

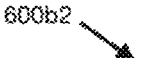
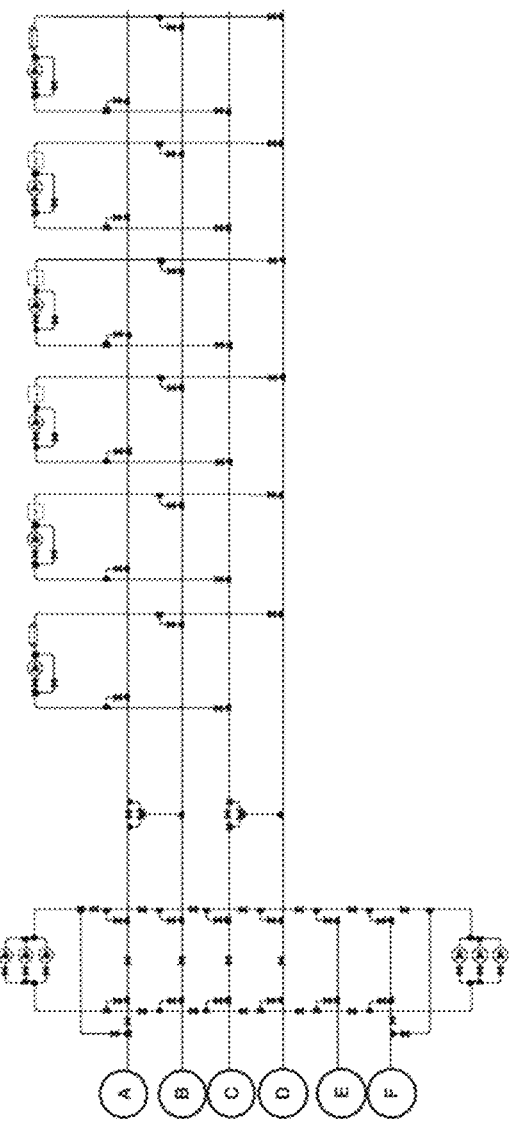
FIG. 6b2

600c

640c 605c   610c   615c     620c     625c   630c   635c

600d

600e

600f

600g

600h

600i

700

705 — WEATHER DATA

710 — BUILDING DATA

715 — LOAD CURVE MAKER

720 — CONTROL PATH CREATOR

725 — LOAD CURVE [TIME, KBTU/HR

730 — CONTROL PATH

740 — CP-EQUIPMENT TRANSLATOR

735 — WEATHERMAKER

750 — TEST WALL EQUIPMENT

755 — TESTER [TEST CHAMBER + HYDRONIC SHROUD]

900

1000

1100

1200

CONFIGURABLE TEST PLATFORM

FIELD OF INVENTION

The present disclosure relates to testing equipment, more specifically, but not exclusively, a configurable test platform that allows control sequences to be easily configured and tested for various equipment layouts.

BACKGROUND

Today, testing equipment for HVAC and other uses is performed by testing the individual pieces of equipment, looking up load tables in books, and calculating if the equipment is sized correctly. In some instances, energy simulation software is used to determine the amount of loads needed. However, these results are theoretical and do not take into account actual equipment and actual physical loads that the equipment would need to interact with.

SUMMARY

This summary is provided to introduce a selection of concepts in a simplified form that are further described below in the Detailed Description section. This summary does not identify required or essential features of the claimed subject matter. The innovation is defined with claims, and to the extent this Summary conflicts with the claims, the claims should prevail.

Various embodiments described herein provide a system for testing equipment systems, using a test chamber. For example, in some embodiments a test chamber is paired with a system builder that is configured to build and apply an equipment load to the test chamber. A load maker is also configured to build and apply a predefined load to the test chamber; and a tester is also included which measures action of the equipment load and the predefined load within the test chamber, producing a test state. In some embodiments, the system builder comprises system builder equipment and a system configuration matrix that attaches the system builder equipment to each other and attaches the system builder equipment to the test chamber. In some embodiments, the system builder equipment comprises at least two of a heating and cooling section, a pumping section, a storage section, a heat exchange section, and a mixing section. Various embodiments described herein relate to a test chamber that comprises a chamber and test chamber equipment, and the test chamber equipment provides test state distribution, the test state distribution comprising radiant state distribution, air state distribution, or convection state distribution.

Various embodiments are described wherein the test chamber equipment comprises an air handler, a variable air chamber box, a radiant floor, or a radiator to apply the predefined load. Various embodiments are described wherein the test chamber is substantially covered in a hydronic shroud. Various embodiments are described wherein the equipment load is a dynamic load and wherein the predefined load is a dynamic load. Various embodiments are described wherein the test chamber equipment further comprises a hot water tank and a cold water tank, and wherein the hot water tank and cold water tank are configured to provide dynamic heating and cooling to the hydronic shroud. Various embodiments are described wherein the system builder equipment comprises at least two of a heating and cooling section, a pumping section, a storage section, a heat exchange section, and a mixing section. Various embodiments additionally include the system configuration matrix comprising multiple two way valves, the system configuration matrix operationally able to couple at least two of system building equipment to create the equipment load. Various embodiments are described wherein the load maker creates a zone mass using a buffer tank.

Various embodiments described herein relate to a method of determining test chamber behavior comprising a test chamber, a system builder, and a weathermaker system, the weathermaker system included in a system comprising a processor and a memory, the method comprising: configuring the system builder, creating a system builder configuration; using the system builder configuration to create a first dynamic load in a test chamber; using the processor and memory to determine a second dynamic load producing a determined second dynamic load configuring the weathermaker system to create the determined second dynamic load in the test chamber; and using an interaction of the first dynamic load and the second dynamic load in the test chamber to determine test chamber behavior.

Various embodiments are described wherein configuring the system builder comprises configuring equipment associated with the system builder using a two-way valve matrix. Various embodiments are described wherein the test chamber behavior comprises state in the test chamber when the first dynamic load and the second dynamic load are simultaneously in the test chamber for a determined amount of time. Various embodiments are described wherein the test chamber allows state distribution, and wherefore the state distribution comprises radiant state distribution, air state distribution, or convection state distribution. Various embodiments are described wherein determining the state in the test chamber comprises determining when the second dynamic load balances the first dynamic load. Various embodiments are described wherein determining when the second dynamic load balances the first dynamic load comprises determining when the state of the second dynamic load is equal to the state of the first dynamic load. Various embodiments are described wherein the state of the first dynamic load is temperature.

Various embodiments described herein relate to a non-transitory machine-readable storage medium configured with data and instructions which upon execution by at least one processor cause one or more devices to perform a method of determining test chamber behavior, comprising a test chamber, a system builder, and a weathermaker system, the weathermaker system included in a system comprising a processor and a memory, the method comprising: configuring the system builder, creating a system builder configuration; using the system builder configuration to create a first dynamic load in a test chamber; using the processor and memory to determine a second dynamic load producing a determined second dynamic load; configuring a weathermaker system to create the determined second dynamic load in the test chamber; and using an interaction of the first dynamic load and the second dynamic load in the test chamber to determine test chamber behavior. Various embodiments described herein include using additional machine learning to determine the second dynamic load.

BRIEF DESCRIPTION OF THE FIGURES

In order to better understand various example embodiments, reference is made to the accompanying drawings, wherein:

FIGS. 6*b*1 and 6*b*2 illustrate an example schematic of a system builder;

FIG. 6*j* illustrates an example of a configuration matrix configured to provide a complex system builder configuration;

DETAILED DESCRIPTION

Figure 1:
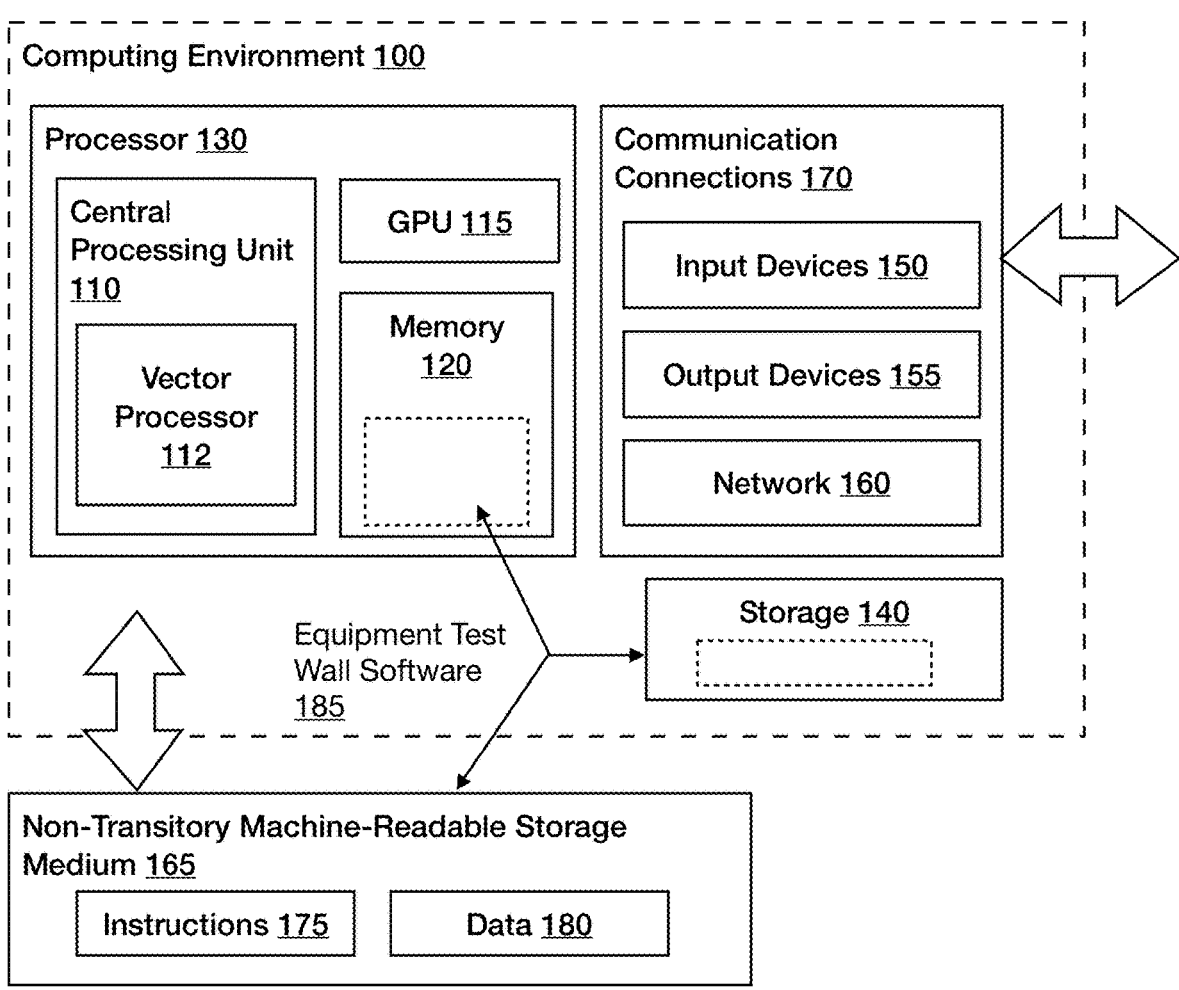
FIG. 1 illustrates a generalized example of a suitable computing environment in which described embodiments may be implemented.

Disclosed below are representative embodiments of methods, machine-readable media, and systems having particular applicability to systems and methods for warming up a simulation. Described embodiments implement one or more of the described technologies.

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments. "One embodiment", "an embodiment", "one example" or "an example" means that a particular feature, structure or characteristic described in connection with the embodiment or example is included in at least one embodiment of the present embodiments. Thus, appearances of the phrases "in one embodiment", "in an embodiment", "one example" or "an example" in various places throughout this specification are not necessarily all referring to the same embodiment or example. Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order.

For convenience, the present disclosure may be described using relative terms including, for example, left, right, top, bottom, front, back, upper, lower, up, and down, as well as others. It is to be understood that these terms are merely used for illustrative purposes and are not meant to be limiting in any manner.

Embodiments in accordance with the present embodiments may be implemented as an apparatus, method, or computer program product. Accordingly, the present embodiments may take the form of an entirely hardware embodiment, an entirely software embodiment (including firmware, resident software, micro-code, etc.), or an embodiment combining software and hardware aspects that may be referred to as a "system." Furthermore, the present embodiments may take the form of a computer program product embodied in any tangible medium of expression having machine-usable program code embodied in the medium.

Any combination of one or more non-transitory machine-usable or machine-readable media may be utilized. For example, a machine-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. Computer program code for carrying out operations of the present embodiments may be written in any combination of one or more programming languages.

The flowchart and block diagrams in the flow diagrams illustrate the architecture, functionality, and operation of possible implementations of systems, methods, and computer program products according to various embodiments of the present embodiments. In this regard, each block in the flowchart or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions. These computer program instructions may also be stored in a machine-readable medium that can direct a computer or other programmable data processing apparatus to function in a particular manner, such that the instructions stored in the machine-readable medium produce an article of manufacture including instruction means which implement the function/act specified in the flowchart and/or block diagram block or blocks.

Although the operations of some of the disclosed methods are described in a particular, sequential order for convenient presentation, it may be understood that this manner of description encompasses rearrangement, unless a particular ordering is required by specific language set forth below. For example, operations described sequentially can be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "determine," "build," and "identify" to describe the disclosed technology. These terms are high-level abstractions of the actual operations that are performed. The actual operations that correspond to these terms will vary depending on the particular implementation and are readily discernible by one of ordinary skill in the art.

As used herein, the terms "comprises," "comprising," "includes," "including," "has," "having," or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). "Program" is used broadly herein, to include applications, kernels, drivers, interrupt handlers, firmware, state machines, libraries, and other code written by programmers (who are also referred to as developers) and/or automatically generated. "Optimize" means to improve, not necessarily to perfect. For example, it may be possible to make further improvements in a program or an algorithm which has been optimized. "Determine" means to get a good idea of, not necessarily to achieve the exact value. For example, it may be possible to make further improvements in a value or algorithm which has already been determined.

Additionally, any examples or illustrations given herein are not to be regarded in any way as restrictions on, limits to, or express definitions of any term or terms with which they are utilized. Instead, these examples or illustrations are to be regarded as being described with respect to one particular embodiment and as being illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms. Language designating such nonlimiting examples and illustrations includes, but is not limited to: "for example," "for instance," "e.g.," and "in one embodiment."

The technical character of embodiments described herein will be apparent to one of ordinary skill in the art, and will also be apparent in several ways to a wide range of attentive readers. Some embodiments address technical activities that are rooted in computing technology, such as determining specific control sequences for specific equipment to handle a given load with the most energy saving. Disclosures and embodiments presented herein provide a quick way of providing an extraordinarily wide array of physical systems with different characteristics and topologies Such disclosures also provide for conducting a wide array of physical experiments, such as sensor calibration timing, validation of equipment specifications, measurement and verification approaches. Other advantages based on the technical characteristics of the teachings will also be apparent to one of skill from the description provided.

1. Overview

Disclosed herein are systems and methods to create and use a configurable test platform. If there were a test platform that would produce real loads and use real equipment that must work against those loads it would be very helpful in determining actual energy performance and behavior in a real-world context.

Buildings, and spaces within buildings, are unique and have their own peculiarities that are not entirely reflected by a bare recitation of building characteristics, no matter how detailed. Buildings are slow to change state, and state changes often depend on external factors such as weather, the number of people in the building over the course of a day, etc. So, determining if a state change system within a building is behaving correctly can be a long, tedious process. As everything in a building is thermodynamically connected, it can be very difficult to tell if the building is acting as designed, as a thermostat, say, placed in the zone next to where it should be will heat up not only that incorrect zone but also will provide heating to the correct zone too, making the error very difficult to find. When creating systems for new buildings or when adding new equipment to an existing building, it would be of benefit to be able to actually test such systems in real world conditions—rather than just in simulations—prior to installation to avoid making costly errors. It would also be of benefit to be able to test proposed equipment control sequences in a real test environment where the control sequences are run on equipment and fed into a space with known state loads to work against. This may be used to ensure that equipment programmed with the control sequences can actually handle the expected load, including weather that might be encountered, throughout a period of time.

An illustrative example comprises a test wall and a configuration matrix attached to a test chamber. The test wall may contain a collection of equipment, such as heating and cooling sources, pumps, heat exchangers, valves, tanks, and so on). The configuration matrix allows the equipment to be joined in such a way that nearly any type of state system can be built in a few minutes by use of the configuration matrix. This gives an extremely high degree of flexibility in testing a wide range of system topologies and configurations. The test chamber is attached to the configured equipment and a load maker. The equipment transfers load into the test chamber. For example, the equipment may dynamically transfer state, such as heat, into the test chamber. Ideally, both the equipment and the load maker are pumping state into the test chamber simultaneously. In an illustrative example, this may be thought of as modeling a building HVAC with the effects of weather. The measurements in the test chamber then lets the testers know how well the equipment was able to counteract states such as weather (as represented by the state produced by the weathermaker) in the test chamber. In another illustrative embodiment, state is inserted into the test chamber through the weathermaker that represents the thermodynamic nature of the building. Then the configured equipment transfers state into the test chamber to see, e.g., if it can offset the building state.

II. Example Computing Environment

FIG. 1 illustrates a generalized example of a suitable computing environment 100 in which portions of described embodiments may be implemented. The computing environment 100 is not intended to suggest any limitation as to scope of use or functionality of the disclosure, as the present disclosure may be implemented in diverse general-purpose or special-purpose computing environments.

With reference to FIG. 1, the computing environment 100 may include a processor 130. This processor 130 may comprise at least one central processing unit 110 and memory 120. The central processing unit 110 executes machine-executable instructions and may be a real or a virtual processor. It may also comprise a vector processor 112. In a multi-processing system, multiple processing units execute machine-executable instructions to increase processing power and as such the vector processor 112, GPU 115, and CPU 110 can be running simultaneously. It should be apparent, however, that in various embodiments elements belonging to the processor 130 may not be physically co-resident. For example, the CPU 110 and GPU 115 may be attached to boards that are physically separate from each other.

The memory 120 may be volatile memory (e.g., registers, cache, RAM), non-volatile memory (e.g., ROM, EEPROM, flash memory, etc.), or some combination of the two. The memory 120 stores software 185 implementing the described methods and systems, where necessary, of aligning and modifying inaccurate polygons.

A computing environment may have additional features. For example, the computing environment 100 includes storage 140, one or more input devices 150, one or more output devices 155, one or more network connections (e.g., wired, wireless, etc.) 160 as well as other communication connections 170. An interconnection mechanism (not shown) such as a bus, controller, or network interconnects the components of the computing environment 100. Typically, operating system software (not shown) provides an operating environment for other software executing in the computing environment 100, and coordinates activities of the components of the computing environment 100.

The storage 140 may be removable or non-removable, and includes magnetic disks, magnetic tapes or cassettes, CD-ROMs, CD-RWs, DVDs, flash drives, or any other medium which can be used to store information and which can be accessed within the computing environment 100. The storage 140 stores instructions for the software, such as software 185 to implement systems and methods used to configure test platforms.

The input device(s) 150 may be a device that allows a user or another device to communicate with the computing environment 100, such as a touch input device such as a keyboard, video camera, a microphone, mouse, pen, or trackball, a digital camera, a LiDAR device, a scanning device such as a digital camera with a scanner, touchscreen, joystick controller, a wii remote, or another device that provides input to the computing environment 100. For audio, the input device(s) 150 may be a sound card or similar device that accepts audio input in analog or digital form, or a CD-ROM reader that provides audio samples to the computing environment. The output device(s) 155 may be a display, a hardcopy producing output device such as a printer or plotter, a text-to speech voice-reader, speaker, CD-writer, or another device that provides output from the computing environment 100.

The communication connection(s) 170 enable communication over a communication medium to another computing entity. The communication medium conveys information such as machine-executable instructions, compressed graphics information, or other data in a modulated data signal.

Communication connections 170 may comprise input devices 150, output devices 155, and input/output devices that allows a client device to communicate with another device over network 160. A communication device may include one or more wireless transceivers for performing wireless communication and/or one or more communication ports for performing wired communication. These connections may include network connections, which may be a wired or wireless network such as the Internet, an intranet, a LAN, a WAN, a cellular network or another type of network. It will be understood that network 160 may be a combination of multiple different kinds of wired or wireless networks. The network 160 may be a distributed network, with multiple computers, which might be building controllers, acting in tandem. A communication connection 170 may be a portable communications device such as a wireless handheld device, a personal electronic device, etc.

Machine-readable media are any available non-transitory tangible media that can be accessed within a computing environment. By way of example, and not limitation, with the computing environment 100, non-transitory machine-readable media may include memory 120, storage 140, communication media, and combinations of any of the above. To aid in understanding, FIG. 1 shows a non-transitory machine readable storage medium 165 and associated contents; it will be appreciated that the non-transitory machine readable storage medium 165 may correspond to the memory 120, the storage 140, or similar devices (not shown) accessible via the communication connections 170. As used herein, the term "non-transitory" will be understood to exclude transitory signals but to include all forms of memory and storage, including both volatile and non-volatile memories. This non-transitory machine readable storage medium 165 may store instructions 175 and data 180. Data sources may be computing devices, such as general hardware platform servers configured to receive and transmit information over the communications connections 170. The computing environment 100 may be an electrical controller that is directly connected to various resources, such as HVAC resources, and which has CPU 110, a GPU 115, Memory 120, input devices 150, communication connections 170, and/or other features shown in the computing environment 100. The computing environment 100 may be a series of distributed computers. These distributed computers may comprise a series of connected electrical controllers.

Further, data produced from any of the disclosed methods can be created, updated, or stored on tangible machine-readable media (e.g., tangible machine-readable media, such as one or more CDs, volatile memory components (such as DRAM or SRAM), or nonvolatile memory components (such as hard drives) using a variety of different data structures or formats. Such data can be created or updated at a local computer or over a network (e.g., by a server computer), or stored and accessed in a cloud computing environment.

While the computing environment 100 is shown as including one of each described component, the various components may be duplicated in various embodiments. For example, the CPU 110 may include multiple microprocessors that are configured to independently execute the methods described herein or are configured to perform steps or subroutines of the methods described herein such that the multiple processors cooperate to achieve the functionality described herein. Further, where the computing environment 100 is implemented in a cloud computing system or a swarm computing system, the various hardware components may belong to separate physical systems. For example, the processor 130 may include a first processor in a first cloud server and a second processor in a second cloud server.

III. Disclosure for an Example Configurable Test Platform

Figure 2:
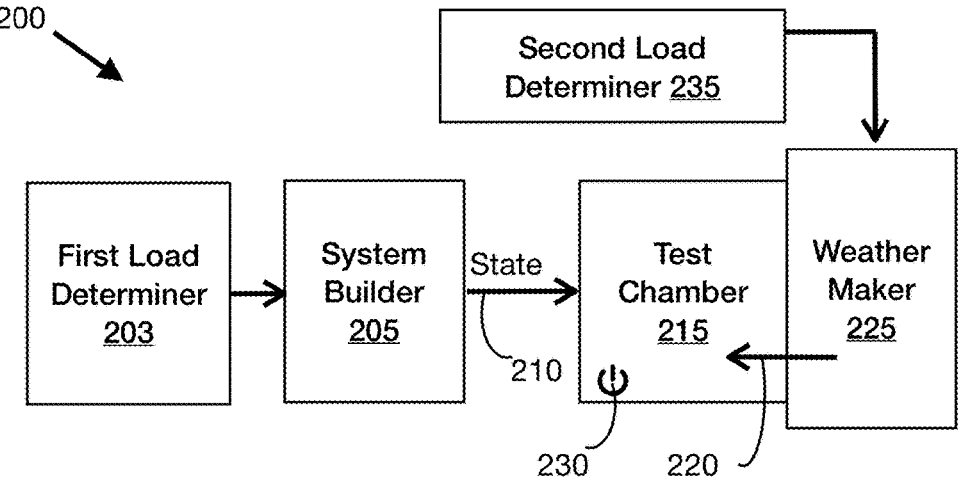
FIG. 2 illustrates an example of a flow diagram which describes, at a high level, a configurable test platform.

FIG. 2 at 200 illustrates an example of a flow diagram which describes, at a high level, a configurable test platform. The system 200 shown illustrates various functional components and some interactions therebetween. The configurable test platform 200 includes a first load determiner 203. This load determiner 203 may be virtually any system capable of determining a state load for a controlled space. This "controlled space" should be defined generously. It may refer to a single building, a collection of related buildings, a collection of related buildings and space around them, a collection of unrelated related buildings, a collection of unrelated buildings and space around them, an outside space such as a garden with irrigation, a portion of a building, such as a floor, a zone, a room, several rooms, multiple zones in a single room, multiple zones across several rooms, multiple zones across several buildings, etc. Many different states 210 may be used in the configurable test platform 200, such as humidity, atmospheric pressure, sound pressure, occupancy, indoor air quality, co2 concentration, light intensity, or another state that can be measured or controlled. The first load determiner 203 determines the amount of state needed to keep a controlled space at a desired state over time. Building—controlled space—state is dynamic by its nature. For example, using heat as an exemplary state, a building has many ways of both gaining and losing heat over time. Some of these ways are solar heat gains (the increase in heat from absorbing solar energy), the heat that people in the building produce, and the heat produced from equipment such as lighting. Heat is also lost from the building itself, such as from ventilation, windows, and leakage from the building itself. Weather also has an affect on the building temperature. Other states may also be considered. For example states such as humidity, atmospheric pressure, sound pressure, occupancy, indoor air quality, $CO^2$ concentration, light intensity, or another state that can be measured or controlled can all be used within a configurable test platform.

Load is the amount of state that needs to be added or removed from a space to maintain the state in a requested range. If the state being considered is temperature, then the load is the amount of heat (e.g., state) that needs to be added or removed by the HVAC system to achieve the desired temperature over time, while taking into account the sources that will be acting on the space, such as those discussed above. If the state is humidity, then the load is the amount of humidity that needs to be supplied or subtracted by humidity control equipment to achieve the desired humidity over time. As mentioned earlier, these states are dynamic, and as such, the loads are dynamic as well. These loads are often measured in time series; i.e., they describe how the desired load is expected to vary over time.

A first load determiner 203 determines how much state is to be created to fulfill system requirements. This is discussed with reference to FIG. 10 and the surrounding text. The system builder 205 creates the state 210 determined by the load determiner 203, and then transfers the created state 210 into a test chamber 215. A second load determiner 235 determines how much state is to be created to fulfill the requirements of the test chamber. This second state amount can be thought of conceptually as an amount of state designed to balance the state that is produced by the system builder. In some embodiments, the first load determiner 203 and the second load determiner 235 are the same load determiner. The weathermaker 225 creates the state that had previously been determined by second load determiner 235. It also transfers that state into the test chamber. A sensor 230 measures state within the test chamber. In some embodiments, indoor air quality may be the state 210, with the test chamber 215 comprising filtering equipment, and the weathermaker 225 adding particulate matter as comes from wildfires, pollution, etc.; the weathermaker may add particles consistent with disease, etc. In some embodiments, the state is sound; the test chamber has sound-dampening equipment, white noise, different sources of different types of sound, etc. In some embodiments multiple states are tested at once.

Figure 3:
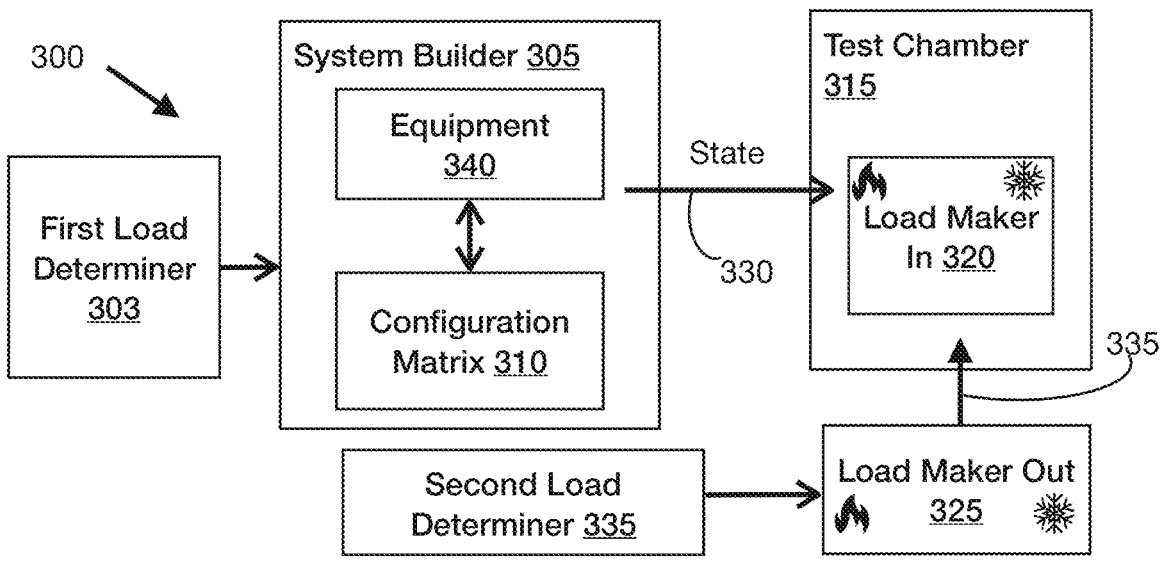
FIG. 3 illustrates an example of a block diagram that describes the configurable test platform in greater detail.

FIG. 3 at 300 illustrates an example of a block diagram that describes the configurable test platform in greater detail. The first load determiner 303 may use a digital twin model to determine load curves. This digital twin model may comprise building a copy of the controlled space under question. This may entail describing the component parts of the space and their thermal characteristics. For example, a wall may comprise brick, insulation, drywall, etc. These parts may be encoded into a simulation, such as a physics-based simulation. In such a simulation, the wall may be modeled as one or more nodes that describe the characteristics of that building layer—A brick node, followed by an insulation load, followed by a drywall node, and so on throughout the building. The outside node has its state values modified by a weather node, with the state modification flowing through the building. At inside nodes that represent the insides of rooms, other functions can be applied, such as those that represent lighting and people (warmth) within the zone. State information continues to propagate until another outside layer is reached, with individual node parameter values representing the state present in the building at time $T_n$. In some embodiments, each outer surface has its own time temperature curve. In some embodiments a building is deconstructed into smaller subsystems, (or zones) so rather than propagating temperature through the entire structure, only a portion of the structure is affected by a given input.

In some implementations, the digital twin models are built on a controller that is associated with the building being controlled. This controller may be the first load determiner 303, the second load determiner 335, both load determiners, etc. In some instances, the controller is embedded in the controlled building and is used to automate the building. A controller may comprise a simulation engine that itself comprises a model of the controlled system the controller is in, or a model of the equipment in the controlled system the controller is in, or both. This model may be called the "physical model." This physical model may itself be trained. Training may comprise past regressions and a cost function. The past regressions are instances of these models being run in the past and the results. The controlled system has at least one sensor whose value can be used to calibrate the physical model(s) by checking how close the model value at the sensor location is to the simulated sensor value equivalent in the physical models. A cost function may be used to determine the distance between the sensor value and the simulated sensor value equivalent. This information can then be used to refine the physical models. This Controller-Controlled system loop may be implemented without use of the cloud and/or an outside network, such as that known colloquially as "the internet". The Controller may control and/or run a Local Area Network (LAN) with which it talks to sensors and other resources. The Controller may be hardwired into the sensors and other resources, or there may be a combined system, with some resources hardwired, and other resources which connect to the LAN. The system builder 305 is configured to build and apply an equipment state load 330 to the test chamber.

The equipment load curves measure state over time, and as such may be dynamic, as discussed previously. To create this, the system builder 305 further comprises equipment 340 and a configuration matrix 310, which allows different configurations of the equipment 340. The system builder is further described in FIGS. 6b1, 6b2, 6c-6h. The weathermaker 225, which also moves state into the test chamber, may comprise a load maker "in", that is located within the test chamber, and/or a load maker "out" 325, which is located outside the test chamber and directs its state 330 to the test chamber. The weathermaker is further described in FIG. 6a. The state load 330 from the system builder 305 that moves into the test chamber 315 may be balanced against the state load produced by the load maker in 320 and load maker out 325. In some embodiments, a test may measure how well the state from the system builder counteracts the state produced from the load makers (320, 325) in the test chamber. In some embodiments, a test may measure how well the state from the system builder counteracts the state produced from the load makers (320, 325) in the test chamber, additional loads, or synthetic zones.

As an illustration of an example of operation, the test chamber load makers may mimic a zone that is in a snowstorm, with the temperature on the (simulated) outside between 10 degrees above zero and 25 degrees above zero over an eight hour period. The system builder will determine how much heat could be pumped into the test chamber over eight hours to keep the temperature at a desired heat. This desired heat may change. This desired heat will be transformed into control sequences to run the equipment. The equipment 340 will then run for the eight hours, using the control sequences to pump state into the test chamber. For example, where the test chamber 315 is outfitted with a hot water radiator (not shown), the equipment 340 will control the delivery of hot water to the radiator to raise the temperature of the test chamber to the current desired heat level, counteracting the effects of the load maker 320, 325 which generally lower the test chamber 315 temperature in simulating the snowstorm. How well the temperature matches the desired temperature over the length of the test (test chamber behavior) tells how well the control sequence worked.

Figure 4:
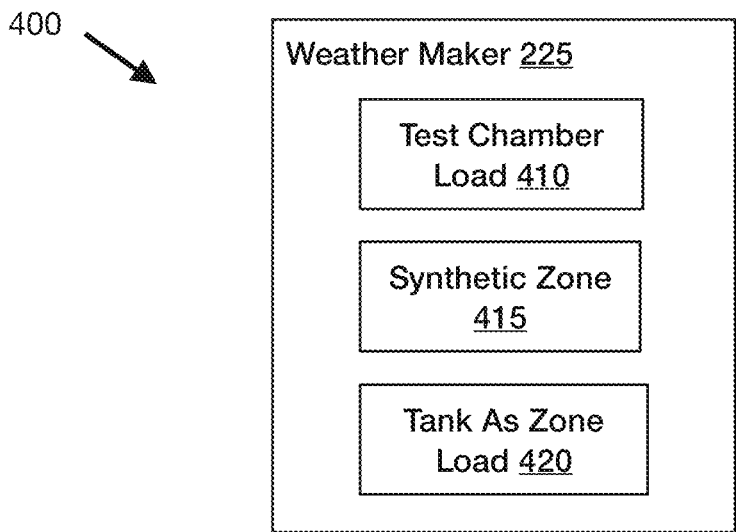
FIG. 4 illustrates examples of certain types of loads that may be used herein.

FIG. 4 at 400 illustrates various example types of loads that may be used. The weathermaker 225 loads may be thought of as falling into three types: test chamber loads 410, synthetic zones 415, and tank-as-zone loads 420. Test chamber loads 410 may apply to a test chamber (which in one example embodiment may be 10'×10×12', but may be smaller or larger depending on usage requirements, system requirements, space requirements, and/or pricing). Heating, cooling, and other loads may be applied to this chamber via a hydronic shroud (an example of which will be described in greater detail below) around the chamber as well as one or more in-room emitters for additional loads. Synthetic zones 415 may be created using heat exchangers that use heat and chilled water to generate specified dynamic loads. In some embodiments, a building includes at least one controlled space. That controlled space may be the entire building, a portion of the building, a room, a portion of a room, an outside area such as a garden, and so on. This may be a space that currently exists, or may be a space that exists only as a design. Buildings are often divided up into zones. These zones often represent distinct areas with separate sensors, such as rooms or other such controlled spaces, but also may represent different areas within a large space, such as a warehouse. Loads may be controlled by modulating flow via energy valve control valves. Within a zone, energy is consumed and energy is applied, both of which change the state of the zone. As such synthetic zones 415 may be modeled using a contraption that consumes energy, and may have energy applied to it. A synthetic load may dump state into a state exchanger, not saving the energy. In an actual hydronically controlled zone, to provide heating and cooling, hot or cool water is pumped through a space. In a synthetic zone 415, the same process is used, e.g., hot water may be generated to provide heat for the synthetic zones, with cold water being generated to provide cooling, except the space does not exist, but rather is mimicked by the heat exchangers releasing energy into, essentially, nowhere. The energy load is dumped.

Tank as zone loads 420 may be buffer tanks of water, fluid, or other substances that can mimic the mass of a zone. Loads can then be applied to the tanks to mimic state in these "real" zones (either built or designed). The mass, for example, in a 25 gallon water tank, may be thought of as equivalent to a room of a certain size. A larger water tank may allow the representation of a larger room, etc. Dynamic loads may be applied using one or more air-to-water heat pumps. Tank as zone loads 420 behave similarly to the synthetic zones 415 except that rather than dumping the load energy, the load energy is preserved by the tank, which can be stored for later use. The synthetic zones 415 gives the ability to have zones of various sizes that can have loads applied thereto (via the weathermaker). In some embodiments, the controls and the test wall may treat these synthetic zones as actual spaces. The weathermaker system 225 may monitor test chamber loads 415, synthetic zones 415, tank as zone loads 420, etc., via one or more temperature sensors, and one or more flow sensors.

Figure 5:
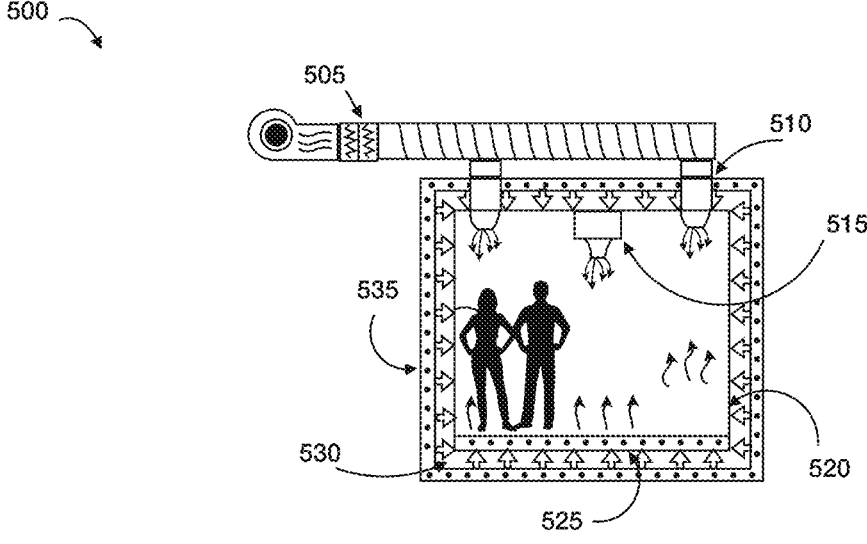
FIG. 5 illustrates examples of equipment that may be used in a test chamber to provide test loads.

FIG. 5 at 500 illustrates examples of equipment that may be used in a test chamber to provide test loads 220, such as the weathermaker 225. One or more air handlers 505 may be included. This may be a variable speed AHU with heating and testing cells, or a different sort of air handler. One or more variable air volume (VAV) boxes 510 may be included. These VAV boxes, which may have reheat, may be used to maintain a more precise temperature (or other state) in the chamber, which may help create and maintain dynamic loads. Additional loads 515 may also be included to drive loads beyond what the rest of the equipment can provide. A radiator 520 (which may be a hydronic radiator) may be used to provide radiant heat. A radiant floor 525 may be used to provide more heat. A hydronic shroud 530 may be provided. This shroud 530 may substantially enclose the test chamber, and may drive heating and cooling loads into the space. In some embodiments, the hydronic shroud 530 may have hydronic loops of plastic tubing that transfer heat. Aluminum transfer plates may be inserted at places within the shroud to spread the heat provided by water flowing through the piping. The hydronic shroud 530 may be covered by insulation 535. This insulation may be rigid insulation. This insulation may be used to ensure that the temperature provided by the liquid is driven into a test chamber, is not lost to outside diffusion, and may also provide stiffness for the shroud. Differential loads may be provided on different sides of the shroud, allowing different types of building walls (e.g., inside, outside, etc.) to be tested. In some embodiments, the hydronic shroud may cover all six sides. In some embodiments a specific side may have a separate temperature source. For example, convection heat 525 may also be provided. This convection heat may be provided on a floor side, or a different side. In some embodiments, convection heat may be provided on multiple sides. In some embodiments, the hydronic shroud 530 covers less than six sides, covers all the sides, but only covers a portion of one or more sides, etc.

Figure 6A:
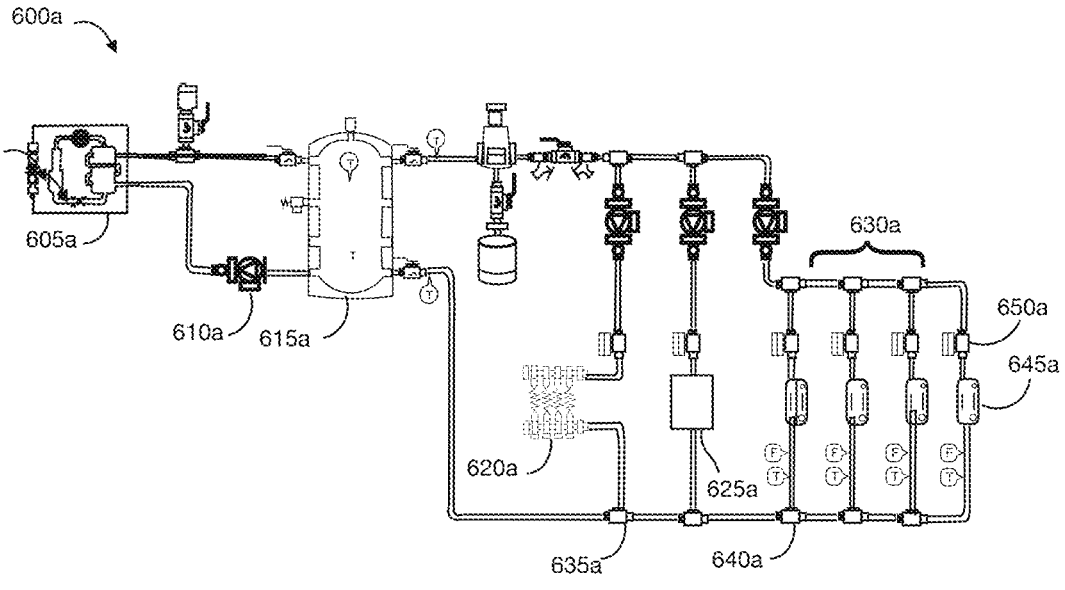
FIG. 6*a* illustrates an example of a weathermaker system.

FIG. 6a illustrates an example 600a of a weathermaker system 225. The system may utilize an air-to-water heat pump 605a which may be used as a ground heat source. The system may also utilize a ground maker circulator pump 610a, a buffer tank 615a for the ground maker (or a buffer tank used for a different reason, such as for a tank as zone load 420), one or more test chamber shroud linker/manifolds 620a that provides heated or cooled water to the hydronic shroud 530, one or more hydronic shroud control valves 635a, one or more tank-as-zone loads 625a, and one or more synthetic zones 630a with heat exchangers, e.g., 645a. Some embodiments of the system include one or more hot water tanks and/or one or more cold water tanks that are used to provide hot or cold water to the linker/manifold(s) 620a, or directly to the hydronic shroud. These hot and cold water tanks may be configured to provide dynamic loads to the hydronic shroud 530 and thus to the test chamber 315. Control valves, e.g., 635a, 640a may be positioned such that different parts of the system builder 205 may be switched on and off by users building configurations for the system builder, by automated systems, by controllers, etc. Controllers 650a may be used to control the flow going into the downstream devices, etc. Turning valves on and off, and changing the controller behavior may allow creation of many different scenarios. The controller behavior may be controlled by some combination of Control Sequence Determination Software 720 and a Controller 740. The Control Sequence Determination Software-Controller combo may use machine learning techniques to determine behavior of the controller. The controller itself may use machine learning techniques to determine near-optimal behavior for given scenarios.

FIGS. 6b1 at 600b1 and 6b2 at 600b2 illustrate a system builder 205 that may be used within the configurable test platform 200. This system builds 205 underlays FIG. 6c, FIG. 6d, and FIG. 6g-FIG. 6j, though other system builders are also envisioned. This figure is drawn using common mechanical engineering symbols and combinations. For example 605b discloses a gate valve. The system is designed to enable thousands of state test system configurations targeting both virtual buildings which may allow the configurations to be tested against the states provided by the test chamber 215 and the other loads provided within the Weathermaker 225. Different state test configurations are created by turning valves on and off.

Figure 6C:
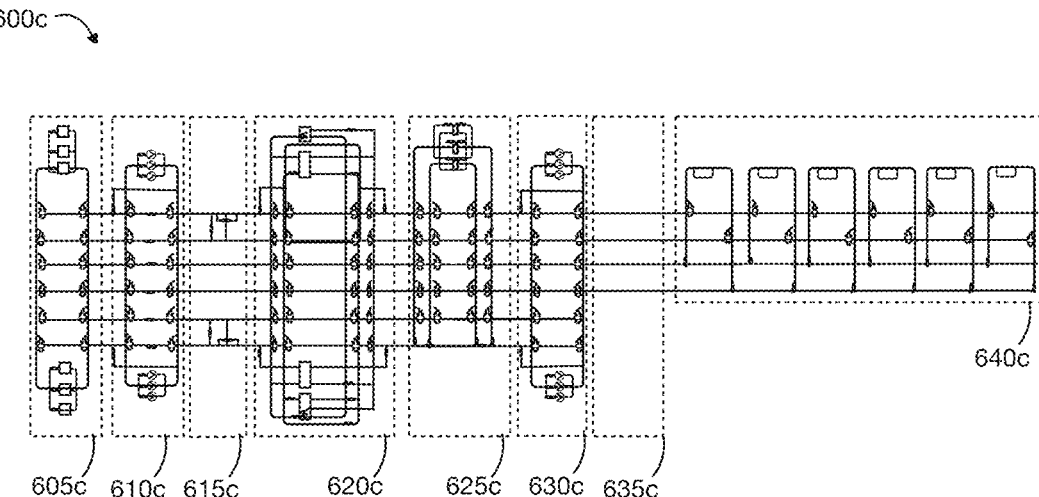
FIG. 6*c* illustrates an example schematic of a system builder with the wall broken into sections.

FIG. 6c at 600c illustrates at least portions of an illustrative system builder being divided into sections. Other system builders may have other configurations. In some system builders, certain types of functional equipment are physically located close to each other. In the illustrated system 600c, heating and cooling sources are located together 605c, pumping elements are located together 610c, routing elements are together 615c, storage elements are together 620c, heat exchange elements 625c, pumping elements 630c, mixing elements 635c, and load elements 640c. Test configurations may be able to use one or more elements from each section, as needed.

Figure 6D:
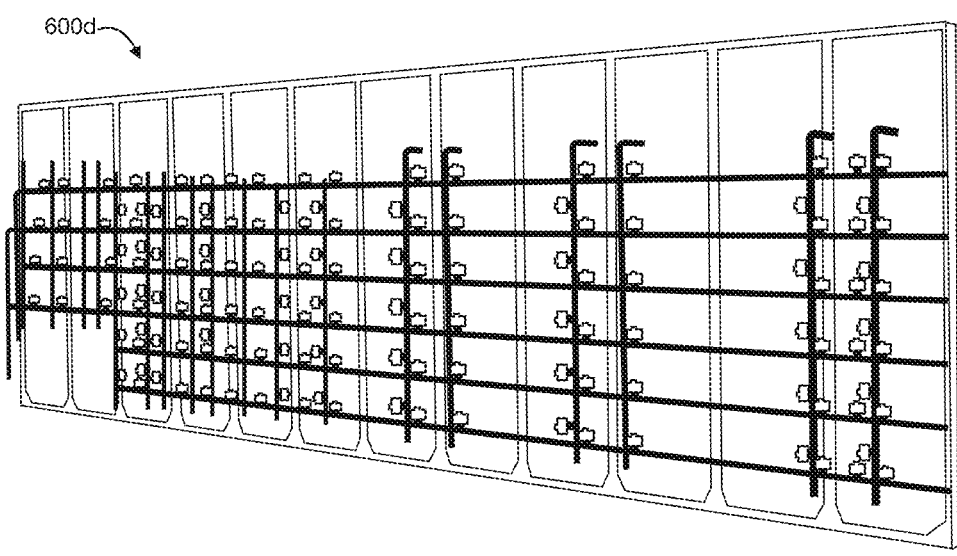
FIG. 6*d* illustrates an example of a configuration matrix set-up that may be used within the system builder.
Figure 6E:
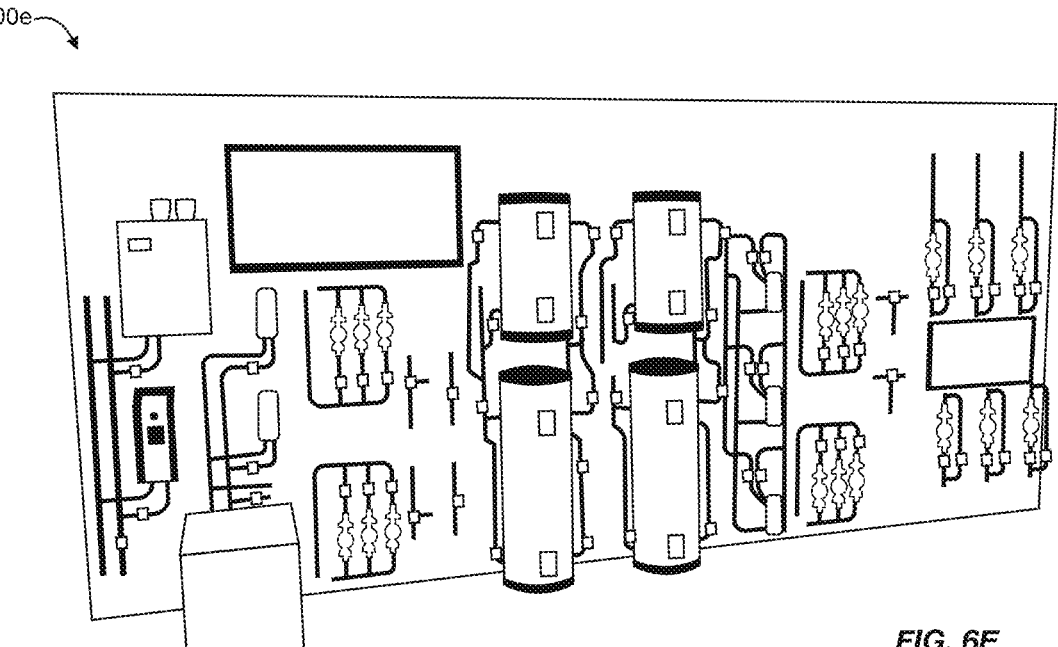
FIG. 6*e* illustrates an example of a partial equipment configuration that may be used within the system builder.

FIG. 6d and FIG. 6e illustrate an example of a system builder built along two sides of a single wall, with the bulk of the two-way valves on a single side 600d. In this example, the two-way valves are arranged in a matrix tower, shown in greater detail with reference to FIG. 6f at 600f. The bulk of the equipment used to create state are built on the other side 600e of the wall shown at 600d. Many other implementations are envisioned, such as all equipment and valves built on a single wall, the system builder built on multiple walls, portions of the system builder built as stand-alone equipment, and so on.

Figure 6F:
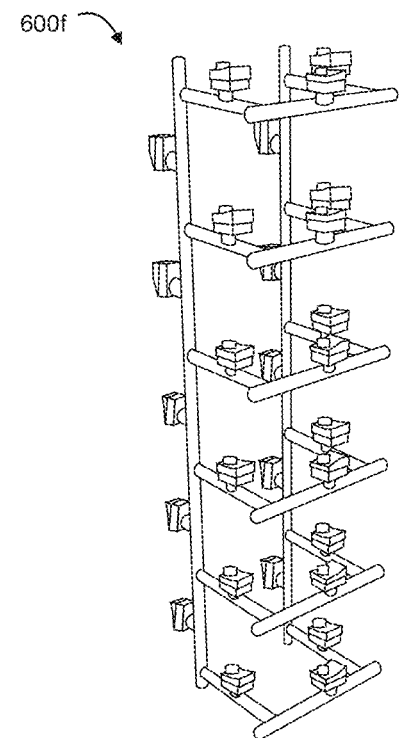
FIG. 6*f* illustrates an example of a two-way valve configuration that may be used within the system builder.

FIG. 6f at 600f illustrates a potential valve setup for a system builder 205. In this illustrative embodiment, two way valves are built into towers that contain 28 of the 2-way valves. Other size towers and other non-tower configurations are also envisioned. In this illustrative embodiment, opening and closing these two-way valves configures the different possible system builder configurations.

Figure 6G:
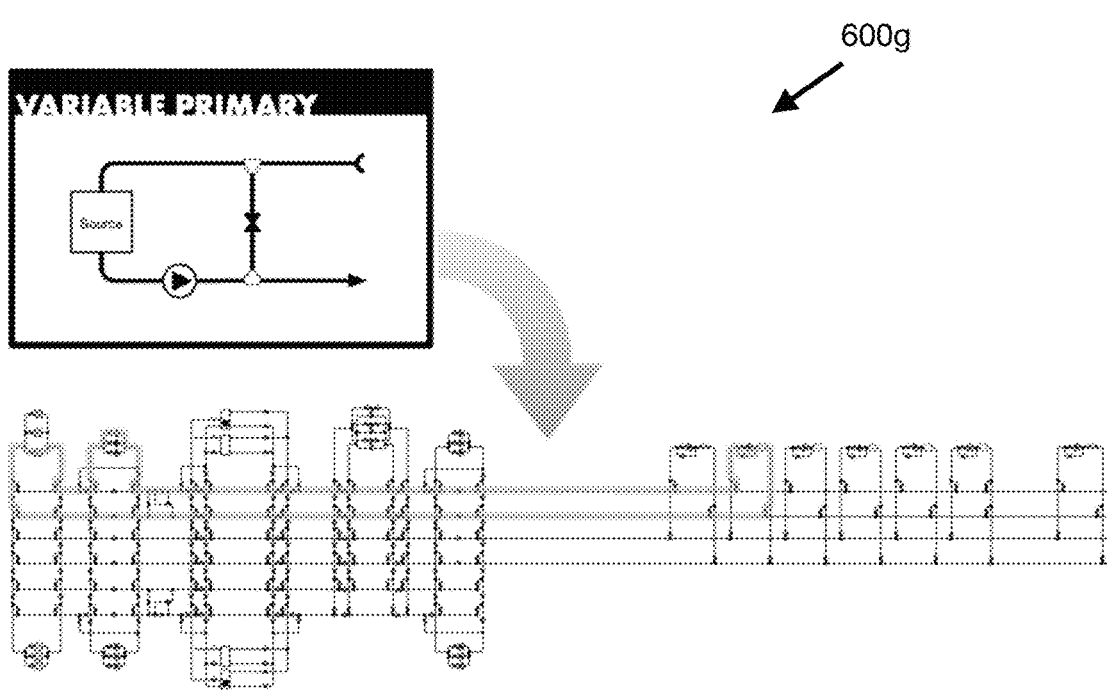
FIG. 6*g* illustrates an example of a configuration matrix configured to provide a variable primary system builder configuration.
Figure 6H:
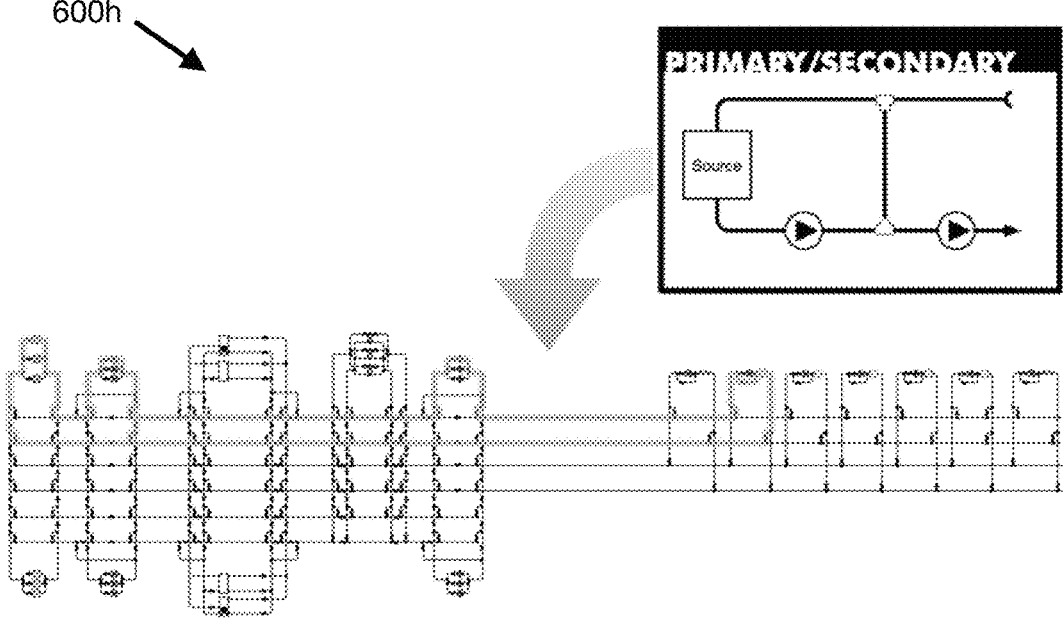
FIG. 6*h* illustrates an example of a configuration matrix configured to provide a primary-secondary system builder configuration.
Figure 6I:
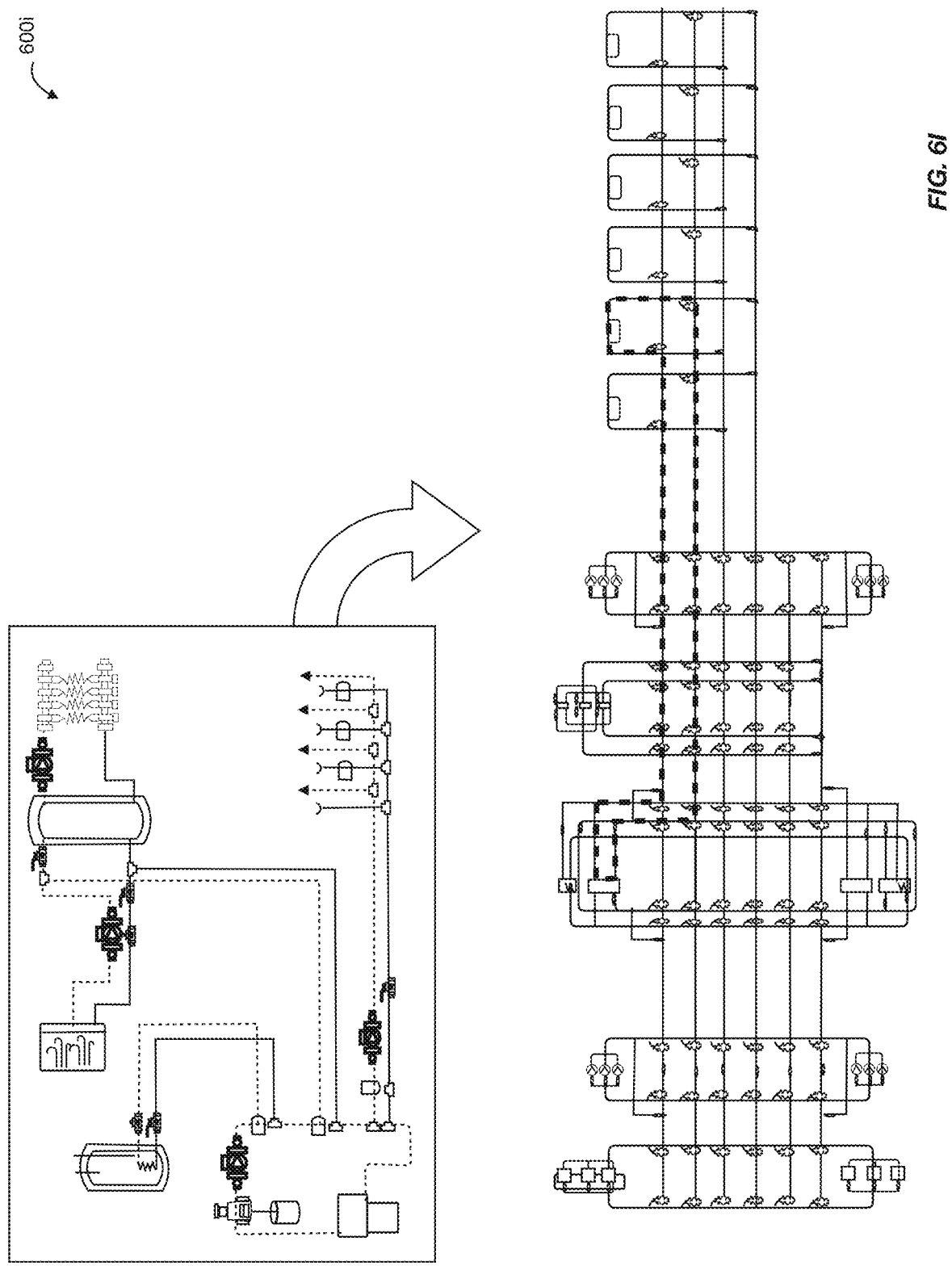
FIG. 6*i* illustrates an example of a configuration matrix configured to provide a complex system builder configuration.

FIG. 6g at 600g illustrates a way to create a variable primary HVAC system using an example of the system builder 205 that may then be tested using the test chamber 215. FIG. 6h at 600h illustrates a way to create a primary/secondary system using an example of the system builder 205. FIG. 6i at 600i and FIG. 6j at 600j are illustrations of ways to recreate complex systems that integrate components and subsystems containing multiple heating and cooling sources, multiple storage options, and different load sources.

Figure 7:
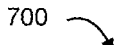
FIG. 7 is an illustration of a flowchart that describes an embodiment of a configurable test platform.
Figure 7:
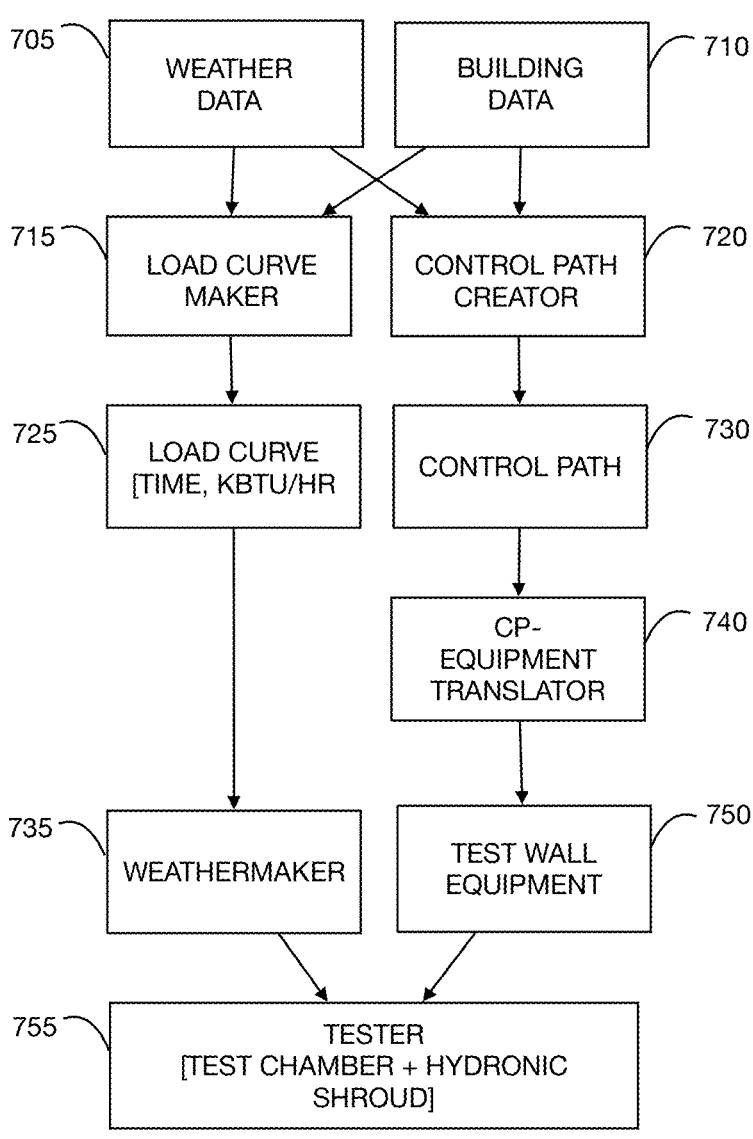

FIG. 7 is an illustration 700 of a flowchart that describes an embodiment of a configurable test platform. The test platform has two tracks; one—the weather track—that determines how much outside load will be produced by weather (a load curve) on a space, the other—the test track—determines the amount of thermal heating/cooling that will be necessary to keep the space at a desired state for a period of time given the weather. Once these are known, the weather track uses the Weathermaker 225 to produce the desired amount of state (the load) to act on the test chamber. The test track uses the determined load to determine how to run equipment in the building under test (the test wall equipment 750 is set up to mimic many, many equipment set ups). Then, it runs the equipment on the test wall 750 with the load specifications to see how well the test wall equipment handles the Weathermaker weather load. This produces a test. The Weathermaker performs its end of the test by physically heating up and cooling down zones, rooms, liquid tanks modeling zones, and so forth, while the test track controls actual equipment to handle the load produced by the Weathermaker.

For the weather track, at operation 705 weather data is acquired. This weather data may be in the form of time/state curves, such as time/temperature curves, time/humidity curves, etc. This state data may be in the form of historic weather patterns, may be collected data, may be weather forecasts, etc. The "weather data" may be any sort of state data; it does not need to be, literally, weather data. At operation 710 building data is gathered. This building data once gathered will be used to determine state flow throughout the building. In some embodiments the building data may be defined by predefined CAD drawings, may be defined by scanning the building with a 3-D floorplan capture system, may be built using an interface that includes predefined but modifiable building materials that can be drawn, a combination of the above, etc.

This building data and the weather data is then given to a program 715 that finds load curves 725 based on building structure and weather load. One such program is the ENERGYPLUS™ building energy simulation program, a program developed and run by The U.S. Department of Energy. A load curve is the amount of energy to be applied to a zone (or other defined location) to achieve a certain state. The load curves may be Kbtu/hr (1000 British thermal units per hour) or in a different unit. These load curves are then given to the weathermaker 735, which then uses the load curves to produce the "desired weather" using the load maker. (See, e.g., FIG. 4.) The thermal units produced by the weathermaker (if temperature is the state) are then applied to a test configuration 755. This comprises the test chamber 500, the hydronic shroud 530, the synthetic zones 415, tank as zone loads 420 any additional load, or any combination thereof.

For the test track, in an example environment, at operation 710, building data is gathered. In some embodiments the building data may be defined by predefined CAD drawings, may be defined by scanning the building with a 3-D floorplan capture system, etc.

A 3-D scanning program may be used to determine size of a space or spaces; previously developed blueprints may be used, a point and touch program may be used to input space statistics, and so on. This building data may then be transformed into a digital twin. The digital twin may be transformed into a machine learning model that utilizes a deep learning neuron model to accurately determine thermal characteristics of the modeled building. One way to do this is to use a neuron model system. This neuron model system may comprise neurons that represent individual material layers of a building with various values of those material layers, such as their resistance and capacitance. When a digital representation of a building is input into an automation system, the component portions of the building that have different thermodynamic qualities are generally defined. These (for an embodiment), may be broken down, in decreasing complexity, into building, floor, zone, surface, layer, and materials. Layers are composed of materials, surfaces are composed of layers, and so on. These neurons may be formed into parallel and branchless neural network strings that propagate heat (or other state values) through them. The neurons may be heterogenous, in that the activation function of the neurons may represent the way heat is propagated through it. In such a neural network, each neuron that represents a material with different thermal (or other state) qualities may have a different activation function. That is, rather than introducing non-linearity into a neural network, the activation function performs a distinct function of representing state flow though the neural network.

Which specific component portions of the building are used depends on the implementation model. Some models may be at a very high level, and so may have structure elements that are composed of floors, for example. Other models may be at a very low level, and so may use structure elements at the materials level, such as type of subfloor, type of underlayment, type of floor, etc. Other choices are possible as well.

Some structures comprise multiple zones (such as rooms or specific areas monitored by a sensor). Each separate zone may be modeled by its own neural model. This neural model may be a single neuron or a number of neurons attached in some form. The collection of neural models can comprise the thermodynamic model of the structure. In such a multiple zone model, when zones share a surface, such as (in a building implementation), a wall, a floor, or a ceiling, the outside neuron of one neural model may be used as the inner neuron of the next. Some zones may overlap with other zones, while some zones do not. The entire structure may be covered in zones, or some locations within a structure may have no explicit zone. Controlled spaces may be defined into multiple subsystems. Any of these portioned controlled spaces may be used as the subsystems.

These zones may be modeled as a neuron model system. A neuron model system comprises neurons that represent individual material layers of a building and various values, such as their resistance and capacitance. These neurons are formed into parallel and branchless neural network strings that propagate heat (or other state values) through them. When a digital representation of a building is input into an automation system, the component portions of the building that have different thermodynamic qualities are generally defined. These (for an embodiment), may be broken down, in decreasing complexity, into building, floor, zone, surface, layer, and materials. Layers are composed of materials, surfaces are composed of layers, and so on.

At operation 720, in some embodiments, a control path creator system inputs the building data 710 and weather data 705 and then outputs control paths 730. One example of such a system is described in U.S. patent application Ser. No. 17/228,119, filed on Apr. 12, 2021, the entire disclosure of which is hereby incorporated herein by reference for all purposes. Using such a method may save 95% of programming or 60% of overall job effort, and take 40% of the time. The method may also comprise a guided graphical process (which might entail using a touchscreen, a browser in a laptop, or a different method. The method may include a 3D LiDAR scan application integrated into the process to determine the building data, there may be a library of equipment and systems that can be used to quickly build an accurate model of the equipment in the building. Also, the building plan, the equipment, location of sensors, etc. may all be created by using a drawing program integrated into the system. For example, sensors and IoT devices my be dragged and dropped into the floor plans, and equipment schematics may be drawn using WISYWIG interfaces. A program (e.g., a control path creator or another program) may then generate the control system design, determine how the equipment may be attached to controllers (automatic point mapping), etc.

When it is time to run, weather 705 or other state data can be fed into the control path creator program 720. This program may use the information about the building and the given state data 705 to produce a control path 730 that gives equipment settings to control the state in the modeled building over time. At 740, that control path is given to a controller, which then uses the control path to operate the test wall equipment 750. In some embodiments, the test wall equipment 750 is operated simultaneously with the Weathermaker. This, among other things, tests the control path given to the equipment, to see, e.g., if it can handle the Weathermaker load and keep the test chamber, the synthetic zones, and/or other test loads, at their desired state.

Figure 8:
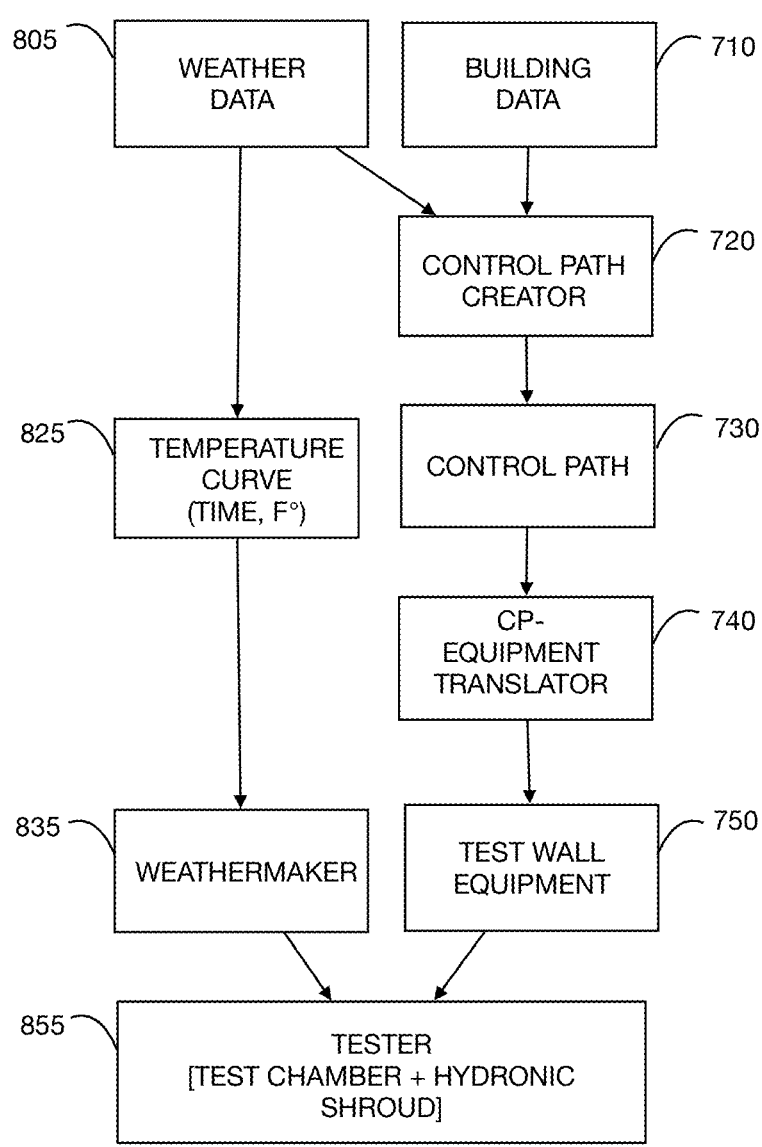
FIG. 8 is an illustration of a flowchart that describes another embodiment of a configurable test platform.

FIG. 8 is an illustration 800 of a flowchart that describes another embodiment of a configurable test platform. Weather data 805 is interpreted as or transformed into a temperature curve 825 or a different sort of state curve. The weathermaker 835 takes as input the temperature curve and uses that to output sufficient state (in the form of controlling the test equipment 340 to model the weather for the test chamber 755. The weathermaker may use the hydronic shroud (and other equipment such as that shown with reference to FIG. 5) to provide a physical load to the test chamber 855 that may be used to test the control sequences produced as output of the control path creator-controller process.

Figure 9:
FIG. 9 illustrates an example of a user interface screen that may be used to input building information.

FIG. 9 illustrates an example 900 of a user interface screen that may be used to input building information. Other screens may be used to draw a building, determine the characteristics of building material used, and so forth. The screen shown in FIG. 9 may be used to input the location of sensor data. Other screens may allow input of equipment, such as HVAC equipment and other equipment that may be used to control the state of the building.

Figure 10:
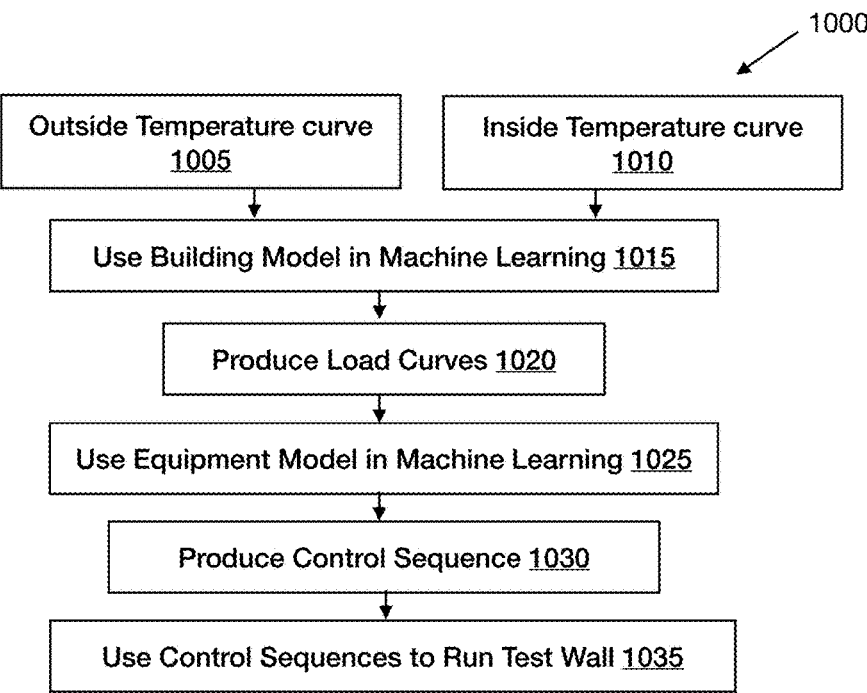
FIG. 10 illustrates an example of another embodiment of developing a control path to run the test wall equipment.

FIG. 10 at 1000 illustrates an example of another embodiment of developing a control path to run the test wall equipment (e.g., FIG. 7 steps 720-740). Each of the FIG. 10 steps may be performed by a control path creator, a load curve maker, neither, or both. The system requirements of a controlled space may be determined. To do so, in some embodiments, a digital twin of a building may be developed, as discussed earlier. This digital twin representation of the building may include digital twin representations of the equipment that will be or is being used to run the space at issue. The digital twin representation may also include a digital twin representation of the controlled space itself, as previously described. One or more controllers with one or more processors may be used for the computing required. The controller(s) may be edge computing machines that work together and do not use an outside internet connection. Rather, when there are multiple controllers, they may run using a local network. A previously trained machine-learning model that uses a digital twin model of the space that is to be tested may be used, and may run on the controller. The machine learning model may run on multiple controllers that are networked together.

One or more temperature/time curves 1005 that models weather that has or will be experienced by the controlled space may be gathered. These gathered temperatures may be used as input into the machine learning building mode 1015 program. There may also be inside temperature curve or curves 1010 that the space itself, or one or more zones within the space, are expected to meet. For example, the temperature in a space may ideally be 65 degrees from 8 pm to 6 am, then change to 72 degrees from 6 am to 8 pm. The machine learning model may then output load time/state curves 1020 that give the amount of state to be injected into the various zones over time to reach the desired inside temperature given the outside temperature and the characteristics of the building itself. Using the time/state curves and knowledge of the equipment in the building, another trained machine learning model 1025 may determine an optimum control sequence 1030 to achieve the desired inside temperatures, given the outside temperatures. This control sequence may then be run on the test wall 1035 using the test wall equipment 750. The output from the test wall equipment is then used in a test procedure 755. This test procedure may use the weathermaker 225 to generate state to counterbalance the test wall equipment state generated. How well the loads are balanced, how much a load is imbalanced or another result may determine test results. The weathermaker may use test chamber loads 410, synthetic zones 415, tank as zone loads 420, additional loads (e.g., 515), or any combination thereof.

Figure 11:
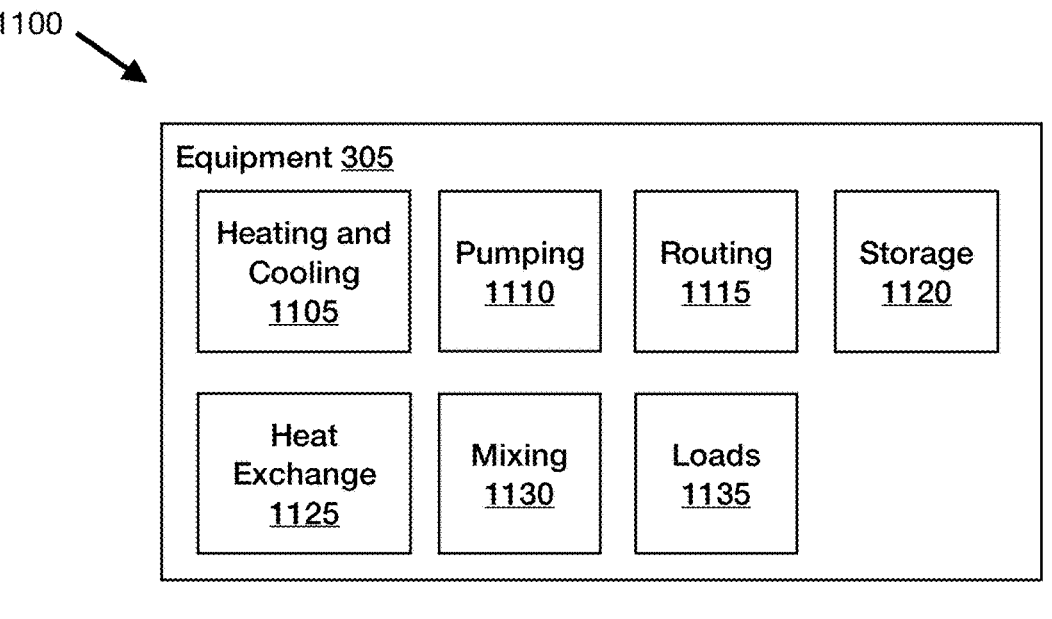
FIG. 11 illustrates possible equipment that may be used on a test wall.

FIG. 11 illustrates possible equipment 1100 that may be used on a test wall. The equipment may comprise some combination of heating and cooling equipment 1105, pumping equipment 1110, routing equipment 1115, storage equipment 1120, heat exchange equipment 1125, Mixing equipment 1130, or Loads 1135.

Figure 12:
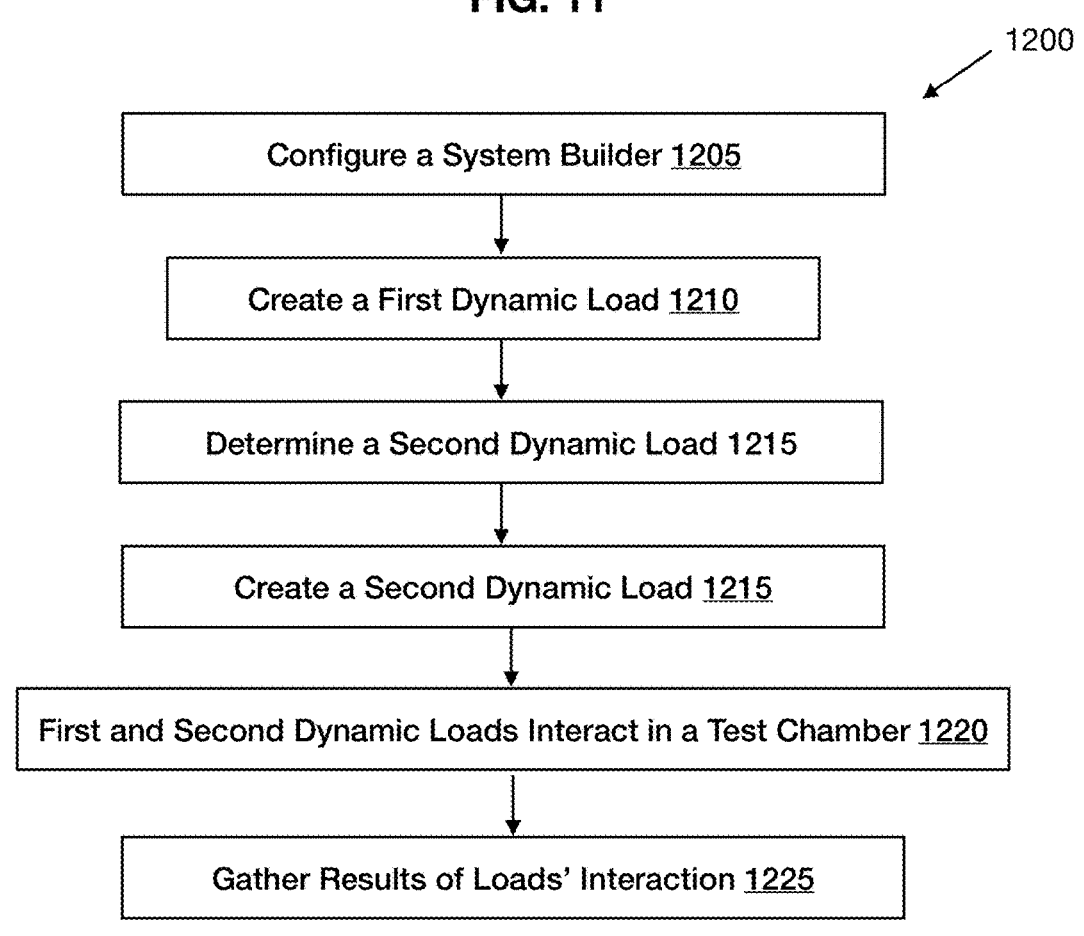
FIG. 12 illustrates an example of a flowchart that describes determining test chamber behavior.

FIG. 12 at 1200 illustrates an example of a flowchart that describes determining test chamber behavior. At step 1205, a system builder is configured. In some embodiments, configuring the system builder comprises determining a control path for system builder equipment, as discussed with reference to FIG. 7 at 710, 720, 730, 740, and 750, and FIG. 10. At step 1210, a first dynamic load is produced. In some embodiments, this dynamic load is created by using the control path configured at 1205 to run equipment 340 controlled by the configuration matrix 310. At 1215, a second dynamic load is created. In some embodiments, this second dynamic load may be created as shown in FIG. 7 at 705, 715, 725 and the surrounding text. In other embodiments, this second dynamic load may be determined as shown in FIGS. 8 at 805 and 825 and the surrounding text. This second dynamic load may be determined by a different system than the one that determines the first dynamic load determiner. This second dynamic load may take the form of a temperature curve (temperature/time) that will mimic weather as described with reference to weather data 705, 805. This may also be described with reference to the test chamber load 410, synthetic zones 415 and tank as zone loads 420. At step 1220, the first dynamic load and second dynamic load interact in the test chamber. As can be seen in FIG. 2 and FIG. 3, state 330 from the system builder (the first dynamic load) and state from the weathermaker 225 (e.g., state from the load maker in 320 and/or state from the load maker out 325) meet in the test chamber 315. The states interact, changing the state within the test chamber. At step 1225, the results are gathered. In some embodiments, when the state being measured is temperature, results will be temperature. The temperature in the test chamber may be measured. If the temperature is what it is supposed to be, or within a certain percentage, then the test may be positive. In some embodiments, determining the results comprises the second dynamic load balancing the first dynamic load. In some embodiments a test is considered positive when the second dynamic load is equal to (or within a certain percent) of the state of the first dynamic load.

It should be apparent from the foregoing description that various example embodiments of the invention may be implemented in hardware or firmware. Furthermore, various exemplary embodiments may be implemented as instructions stored on a machine-readable storage medium, which may be read and executed by at least one processor to perform the operations described in detail herein. A machine-readable storage medium may include any mechanism for storing information in a form readable by a machine, such as a personal or laptop computer, a server, or other computing device. Thus, a machine-readable storage medium may include read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various example embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

I claim:

1. A method of determining test chamber behavior comprising a test chamber, a system builder, and a weathermaker system, the weathermaker system included in a system comprising a processor and a memory, the method comprising:

configuring the system builder, creating a system builder configuration;

applying a control sequence generated using a digital twin to the system builder configuration to create a first dynamic load in the test chamber;

using the processor and memory to determine a second dynamic load producing a determined second dynamic load;

configuring the weathermaker system using a temperature curve to create the determined second dynamic load in the test chamber; and using an interaction of the first dynamic load and the second dynamic load in the test chamber to determine test chamber behavior.

2. The method of claim 1, wherein configuring the system builder comprises multiple pieces of equipment, and further comprising configuring at least one of the multiple pieces of equipment using a two-way valve matrix.

3. The method of claim 2, wherein the test chamber behavior comprises state in the test chamber when the first dynamic load and the second dynamic load are simultaneously in the test chamber for a determined amount of time.

4. The method of claim 3, wherein the test chamber allows state distribution, and wherefore the state distribution comprises radiant state distribution, air state distribution, or convection state distribution.

5. The method of claim 4, wherein determining the state in the test chamber comprises determining when the second dynamic load balances the first dynamic load.

6. The method of claim 5, wherein determining when the second dynamic load balances the first dynamic load comprises determining when the state of the second dynamic load is equal to the state of the first dynamic load.

7. The method of claim 6, wherein the state of the first dynamic load is temperature.

8. The method of claim 1, wherein the system builder uses the digital twin to create the system builder configuration.

9. The method of claim 8, wherein the digital twin comprises interconnected nodes, and wherein state modification flows between the interconnected nodes.

10. The method of claim 1, wherein the system builder comprises system builder equipment and a system configuration matrix that attaches the system builder equipment to each other and attaches the system builder equipment to the test chamber.

11. A system comprising a memory and a processor, wherein the processor is in communication with the memory configured to:

configure a system builder, creating a system builder configuration;

apply a control sequence generated using a digital twin to the system builder configuration to create a first dynamic load in a test chamber;

use the processor and memory to determine a second dynamic load producing a determined second dynamic load;

configure a weathermaker system using a temperature curve to create the determined second dynamic load in the test chamber;

use an interaction of the first dynamic load and the second dynamic load in the test chamber to determine test chamber behavior;

wherein the system builder comprises system builder equipment and a system configuration matrix that attaches the system builder equipment to each other and attaches the system builder equipment to the test chamber;

wherein the system builder equipment comprises at least two of a heating and cooling section, a pumping section, a storage section, a heat exchange section, and a mixing section;

wherein the test chamber comprises a chamber and test chamber equipment, and wherein the test chamber equipment provides test state distribution, the test state distribution comprising radiant state distribution, air state distribution, or convection state distribution;

wherein test chamber equipment comprises an air handler, a variable air chamber box, a radiant floor, or a radiator to apply a predefined load; and wherein the test chamber is substantially covered in a hydronic shroud.

12. The system of claim 11, wherein the first dynamic load and the second dynamic load are applied to the test chamber simultaneously.

13. The system of claim 12, wherein the control sequence is developed using a building model to produce a load curve.

14. The system of claim 11, wherein configuring the system builder comprises multiple pieces of equipment, and further comprising configuring at least one of the multiple pieces of equipment using a two-way valve matrix.

15. The system of claim 14, wherein the test chamber behavior comprises state in the test chamber when the first dynamic load and the second dynamic load are simultaneously in the test chamber for a determined amount of time.

16. The system of claim 15, wherein the test chamber allows state distribution, and wherefore the state distribution comprises radiant state distribution, air state distribution, or convection state distribution.

17. The system of claim 16, wherein the test chamber equipment further comprises a hot water tank and a cold water tank, and wherein the hot water tank and cold water tank are configured to provide dynamic heating and cooling to the hydronic shroud.

18. The system of claim 17, wherein the system builder equipment further comprises at least two of a heating and cooling section, a pumping section, and a storage section.

19. The system of claim 18, wherein the system configuration matrix comprises multiple two way valves.

20. The system of claim 19, wherein a load maker creates a zone mass using a buffer tank.

* * * * *